United States Patent
Fleming et al.

[11] Patent Number: 6,145,763
[45] Date of Patent: Nov. 14, 2000

[54] CARBONACEOUS DEPOSIT-RESISTANT COATING FOR FUEL INJECTORS

[75] Inventors: Jonathan Edward Fleming, Canton; Michael Howard Parsons, Ann Arbor; Robert Eugene Hetrick, Dearborn Heights; William Martin Sheeran, Novi; Xia Zhang, Canton, all of Mich.

[73] Assignee: Ford Global Technologies, Inc., Dearborn, Mich.

[21] Appl. No.: 09/223,170

[22] Filed: Dec. 30, 1998

[51] Int. Cl.[7] .............................. F02M 19/03; H05H 1/24
[52] U.S. Cl. ................................ 239/585.1; 427/249.6; 427/577; 427/490
[58] Field of Search .............................. 239/585.1–585.5, 239/533.1, 533 K, DIG. 19; 123/668; 427/577, 579, 489, 490, 249.7, 249.15, 249.6

[56] References Cited

U.S. PATENT DOCUMENTS

| | | |
|---|---|---|
| 3,552,370 | 1/1971 | Briggs et al. . |
| 5,198,263 | 3/1993 | Edwin et al. . |
| 5,237,967 | 8/1993 | Willermet et al. . |
| 5,249,554 | 10/1993 | Tamor et al. . |
| 5,309,874 | 5/1994 | Willermet et al. . |
| 5,771,873 | 6/1998 | Potter et al. . |

FOREIGN PATENT DOCUMENTS 10284476 10/1998 Japan .

OTHER PUBLICATIONS

S.A.E Technical Paper No. 902105 by G. T. Kalghatgi; Deposits in Gasoline Engines—A Literature Review, (1990), pp. 1–29.

*Primary Examiner*—Kevin Weldon
*Attorney, Agent, or Firm*—Damian Porcari

[57] ABSTRACT

An automotive fuel injector having a fluorine-coating amphorous hydronated carbon film coating to resist the formation of carbonaceous deposits thereon. The fluorine-coating amphorous hydronated carbon film is made in part form trifluoromethyltrimethylsilane. The coating helps the fuel injector resist coking or the growth of hard carbonaceous deposits. This reduction in coking and deposits improves the fuel economy and engine performance.

6 Claims, 2 Drawing Sheets

CARBONACEOUS DEPOSIT-RESISTANT COATING FOR FUEL INJECTORS

BACKGROUND OF THE INVENTION

1. Technical Field

This invention is related to a method of preventing the formation of carbonaceous deposits on engine components with the use of an amorphous hydrogenated carbon coating thereon.

2. Description of the Related Arts

Coking or the growth of hard carbonaceous deposits on components near or within the combustion chamber of internal combustion engines has been a long-standing problem. The buildup of deposits in this region can alter engine performance by impairing fuel economy, regulated emissions, and driveability, and in the worst case scenario cause engine damage. A detailed account of such deposits, problems and some attempted solutions can be found in S.A.E. Technical Paper No. 902105 (1990) by G. T. Kalghatgi. Carbonaceous deposits are especially problematic for fuel injectors located within the engine combustion chamber. Direct injection spark ignition (DISI) engines include a fuel injector injecting fuel directly into the combustion chamber.

Keeping the fuel injector free of carbonaceous deposits is important to the efficient and regulated operation of the engine. The fuel injector determines the fuel spray pattern. The fuel injector tips project into the cylinders and operate at high pressure and temperature. The fuel injector is constantly exposed to combustion gas and fuel. It was found that carbonaceous deposits build in a volcano shape around the orifice on the face plate of the injector. By partially blocking the orifice, the deposits reduce fuel flow and change the fuel spray pattern. This results in unstable and uncontrolled fuel mixing and delivery as well as combustion that causes engine knock, decreased fuel economy and increased emissions. While there are several methods to reduce the carbonaceous deposits including improved fuel injector design, and adding dispersion and detergents to the fuel, these alternative methods are insufficient and still allow for the unwanted carbonaceous deposits.

If the fuel injector could be made to resist the carbonaceous deposits, existing fuels and fuel injector designs could be utilized. In the past, components have been coated with amorphous hydrogenated carbon to increase hardness and durability, decrease friction and wear and protect against corrosion. As described in U.S. Pat. Nos. 5,249,554, 5,309,874, and 5,237,967 assigned to Ford Motor Company, and incorporated herein by reference, power train components have been coated with such carbon film coatings to reduce friction and wear related thereto. More recently, coatings have also been applied in an effort to reduce deposit formation. One example is U.S. Pat. No. 3,552,370, issued to Briggs et al, which describes a coating, and method of application, including the constituents of nickel, aluminum and copper for the purpose of reducing heat transfer from the combustion chamber to foster a more complete combustion. In the Briggs patent, a thermal mechanism is utilized preventing deposits. Under this thermal approach, the higher temperature of the coated component promotes combustion rather than deposit of hydrocarbon species. If the coating is used inside the combustion chamber, however, care must be taken with this approach so that the coated surface does not heat to an excessive temperature. If this occurs, the excessively hot coating itself might cause premature combustion. Accordingly, for the prevention of carbonaceous deposits near or in the proximity of the combustion chamber, deposit prevention using a thermal mechanism has significant limitations. Another approach for preventing deposits is a chemical method. Under this approach, a coating is supplied by which the precursor molecules for forming a deposit cannot chemically bond to the surface. An example of this approach is a Teflon™ coating.

However, Teflon™ coatings, in particular, are unsuited for application on many engine components due to the high temperature and high hardness properties required for use in an internal combustion engine. In the case of the injector face plate, the former is the reason for unsuitability.

U.S. Pat. No. 5,771,873, which is commonly assigned, teaches a method of using $SiFl_4$ precursor gases to form a deposit resistant coating. The U.S. Pat. No. 5,771,873 included coatings that also were wear resistant as well as deposit resistant. The present invention has further developed these coatings and has identified F-AHC coatings that are particularly well suited to resist carbonaceous deposits on a fuel injector where wear properties are not as important.

There thus remains a need for a method of reducing and preventing the growth of carbonaceous deposits on fuel injectors.

SUMMARY OF THE INVENTION

Accordingly, an object of the present invention is to prevent the formation of carbonaceous deposits on fuel injectors. In carrying out the above objects, a method is disclosed for providing a deposit resistant coating for an engine component, including the steps of: preparing the surface of the engine component to create an adherent surface; applying a fluorine-containing amorphous hydrogenated carbon film coating to the fuel injector, wherein the fluorine in the coating is obtained by plasma assisted deposition from the gas phase precursor trifluoromethyltrimethylsilane. This precursor species is caused to be present in the plasma in addition to the two other gaseous precursor species methane and tetramethylsilicon which are used to form a well adhered amorphous hydrogenated carbon coating. The invention also discloses a fuel injector for an internal combustion engine, including a film coating, wherein the film coating is fluorine-containing amorphous hydrogenated carbon, or doped amorphous hydrogenated carbon.

DETAILED DESCRIPTION OF THE INVENTION

Figure 1:
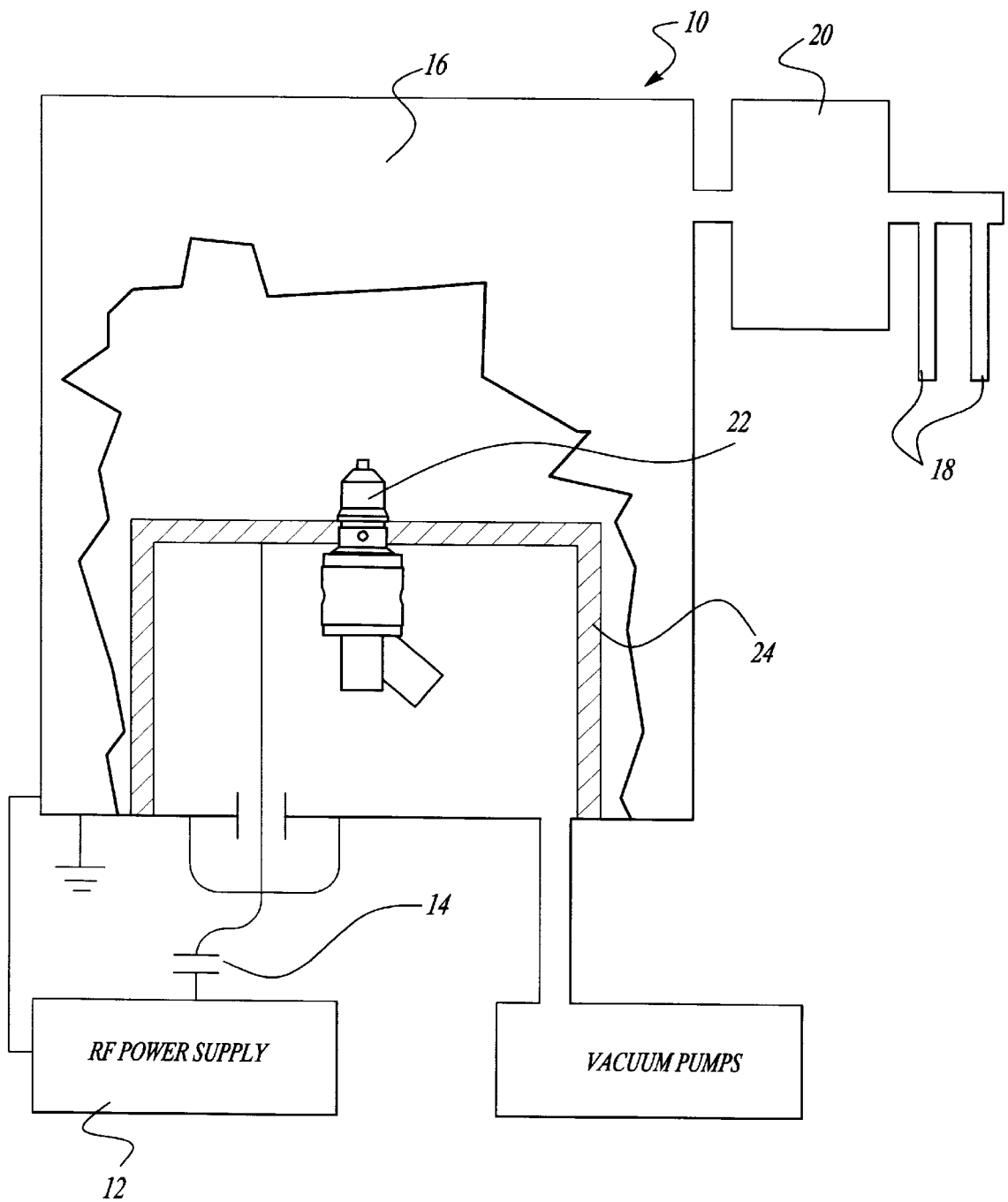
FIG. 1 illustrates a schematic diagram of one embodiment of a vacuum apparatus and associated equipment for applying the fluorine-containing amorphous hydrogenated carbon coating by a plasma enhanced, chemical vapor deposition (PE-CVD) method that employs radio frequency techniques.

The present invention will be described through a series of drawings, which illustrate the preparation and testing of a DISI fuel injector claimed.

The following items are a word list of the items described in the drawings and are reproduced to aid in understanding the invention;

| | |
|----|----|
| 10 | vacuum chamber |
| 12 | RF power supply |
| 14 | capacitor |
| 16 | plasma |
| 18 | precursor gases |
| 20 | controller |
| 22 | fuel injector substrate |
| 24 | support structure |
| 26 | engine |
| 28 | fuel injector |
| 30 | fuel injector face plate |

The present invention serves to provide a fluorine-containing amorphous hydrogenated carbon (F-AHC) coating for engine components which prevents or minimizes the accumulation of carbonaceous deposits thereon. This coating specifically prevents deposit formation on surfaces which either diminish optimum engine performance in terms of regulated emissions or mileage or whose anticipated deposition during normal operation requires design modifications or calibration adjustments that compromise optimum engine performance. Accordingly, those surfaces, which are susceptible or prone to deposit formation, are coated with the fluorine-containing amorphous hydrogenated carbon coating disclosed in this invention.

While not wishing to be bound to any particular theory, it is believed that the amorphous hydrogenated carbon coating serves to prevent the formation of carbonaceous deposits because the surface of the coating is chemically inert with respect to deposit formation chemistry. The presence of the fluorine increases the resistance of the coating to deposit formation chemistry. The stronger carbon-fluorine bonds are more resistant to chemical reaction with other species which might come into contact with the surface and in the process form an adherent deposit. The present coating is especially attractive for automotive applications since the material can withstand higher temperatures and higher mechanical loads than other common deposit resistant coatings such as Teflon™.

Hydrogenated carbon films are believed to consist of isolated $Sp^2$ carbon—carbon bonded clusters. These clusters may be linked by the strong $sp^3$ carbon—carbon bond to form a rigid three-dimensional structure. Due to its structure, the film imparts low friction and wear resistance to its underlying substrate. At low relative humidity, hydrogenated carbon films exhibit friction coefficients in the range of 0.05–0.16 under a contact stress ranging from 0.83 to 1.5 GPa at a sliding speed ranging from 0.03 to 1 meter per second. The use of a carbon based film creates a hard coating with a low coefficient of friction. A diamond-like carbon-based film imparts hardness properties, while a graphite or amorphous carbon-based film imparts lubricant properties.

The amorphous hydrogenated carbon films of the present invention can be applied by various techniques, including direct current, radio frequency, plasma-assisted chemical vapor deposition, ion beam deposition and arc discharge techniques. While a number of different methods may be used to deposit these coatings onto a substrate, a preferred deposition method, involves a low pressure, plasma enhanced, chemical vapor deposition (PE-CVD) technique. As provided in FIG. 1, this low pressure, in the order of 1–100 milliTorr, technique is carried out in a vacuum chamber 10 where an RF power supply 12 is capacitively coupled with a coupling capacitor 14 to electrodes whose electrical activation sustains the plasma 16 among appropriate precursor gases 18 admitted to the vacuum chamber 10 through a gaseous flow rate controller 20. One electrode is the substrate 22 to be coated, shown schematically as a fuel injector, in combination with a support structure 24, while the other electrode in the simplest case, is the grounded wall of the vacuum system which surrounds, but is electrically insulated from the substrate 22.

In preparation for placement in the vacuum chamber, the particular portion of the substrate 22 to be coated was soaked and flushed in n-heptane and rinsed in acetone and methanol to remove light coatings of grease and other hydrocarbons. Next, the substrate 22 was etched for 30 seconds in 3% nital (3% of nitric acid in ethanol) and rinsed in ethanol before being blown dry with nitrogen. This precautionary procedure rids the surface of unwanted metallic contaminants. The substrate 22 is then placed in the vacuum chamber 10 and an in-situ Ar sputtering (200–500V) for between 30–60 minutes was performed immediately before film deposition. This precautionary procedure was found to be effective in removing any remaining thin oxide and other contaminant layers. The substrate 22 is then exposed to the precursor gases 18 before the plasma is excited.

The precursor gases include trifluoromethyltrimethylsilane (TFMTMS, $CF_3Si(CH_3)_3$)and at least one hydrocarbon species such as methane or other hydrocarbon gases to form the fluorine-containing amorphous hydrogenated carbon. TFMTMS was selected because it has the combination of elements that react to form the fluorine-containing amorphous hydrogenated coating and its vapor pressure is sufficiently large (about 50 milliTorr at room temperature) that it is compatible with existing precursor gas delivery equipment and other plasma deposition devices. It is possible that other fluorine containing gases such as carbon tetrafluoride, if caused to be present in the proper concentrations, would also be effective in introducing fluorine to the coating in useful amounts and in a useful form.

The TFMTMS was introduced into the vacuum chamber 10 as a precursor gas. Methane ($CH_4$) was used as an additional precursor gas to increase the carbon atom percentage in the combined precursor gases. The methane flow was 30 sccm and the TFMTMS flow was between 1.0 and 4.0 sccm at a pressure of 20 milliTorr. An RF electric field having a bias potential of 500V was applied between the substrate 22 and the support structure 24 to create a reactive plasma. The plasma causes the ions from the precursor gases 18 to form an F-AHC coating on the substrate 22. The appearance of the coatings and other physical properties such as hardness were nominally identical to non fluorine containing amorphous hydrogenated carbon as described in U.S. Pat. No. 5,771,873. The fluorine was estimated to be present at about 10% by weight in coatings which were most effective for deposit resistance.

Figure 2:
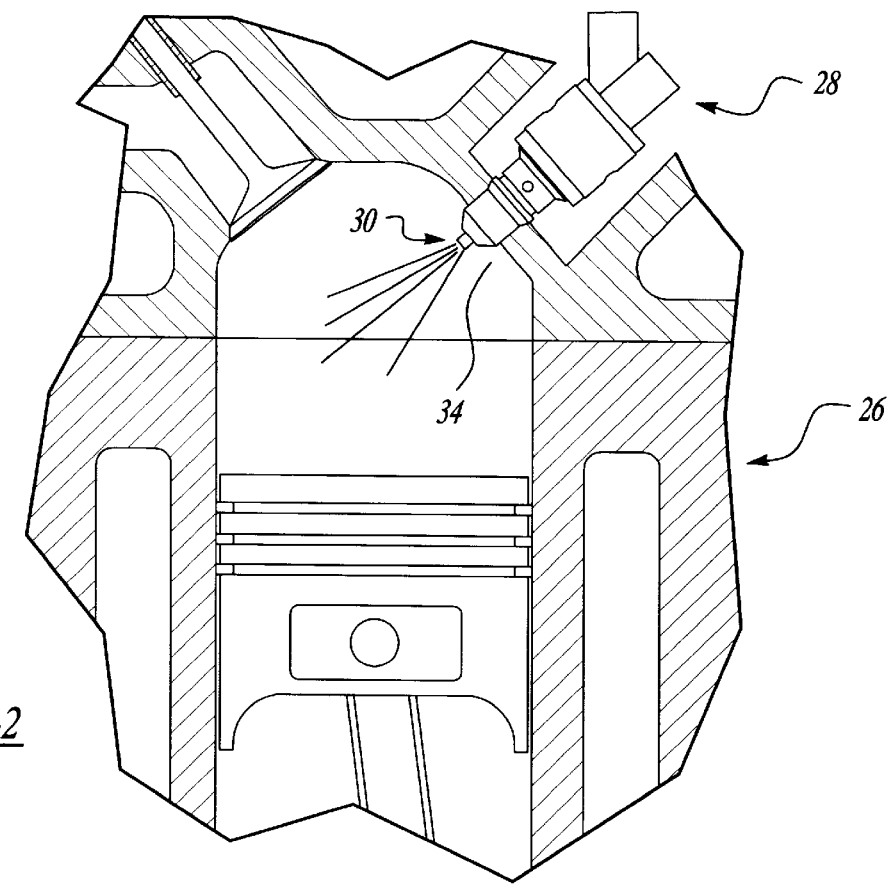
FIG. 2 illustrates a cross-sectional view of an engine including a fuel injector having a F-AHC coating to reduce carbonaceous deposits.

FIG. 2 shows a cross-sectional view of a portion of an internal combustion engine 26. The engine 26 includes a fuel injector 28 coated with the F-AHC coating described above. The fuel injector 28 has a face plate 30 containing the orifice (or orifices, as different injectors may have a variety of opening patterns in their face plates to effect different fuel spray patterns) through which fuel flows into the combustion chamber of the engine when the injector is activated. Both the face plate and the thin length (typically on the order of 1 mm) of the orifice's cylindrical wall are effectively coated in the plasma process to resist carbonaceous deposits.

EXAMPLES

Several experimental results in the laboratory, including tests with operating engines, indicate that the F-AHC coatings are effective for reducing deposits on fuel injectors. The fuel injectors were specifically coated using the TFMTMS method described above.

Example 1

The coating was studied for its ability to reduce deposits in a one cylinder test engine adapted to accept a fuel injector which could spray fuel directly into the combustion chamber. A commercial injector appropriate for this direct injection purpose was tested with and without the F-AHC coating on the injector face plate by running the engine at a fixed operating point that is widely used for engine comparison studies (1500 rpm, intermediate load, near stoichiometric air to fuel ratio (A/F)). As an added feature for purposes of standardization, the fuel injection pulse width, which was adjustable but not under feedback control, was adjusted to occur before the piston arrived at its maximum travel to the top of the combustion chamber. Further, the end of the injector pulse was always adjusted to occur at a fixed position relative to the pistons arrival at that maximal position.

Under these conditions the face plate of the injector is subject to the temperature, cylinder pressure and chemical species that are known (by direct visual inspection) to produce unwanted deposits on the injector faceplate, including the cylindrical wall of the injector orifice which is centered within the faceplate. Deposit buildup which is harmful to engine operation will result in reduced fuel flow through the injector presumably by reducing the effective area of the injector orifice. The result is an increase in the engine A/F. This ratio can be readily measured during engine operation and any increases were assumed to result from undesirable deposit formation. Accordingly the A/F was checked at one hour intervals of engine operation. When an increase in A/F was observed, the injector pulse width was correspondingly increased until this ratio was returned to a near stoichiometric value of 14.6:1 for the fuel type being used in the test.

Figure 3:
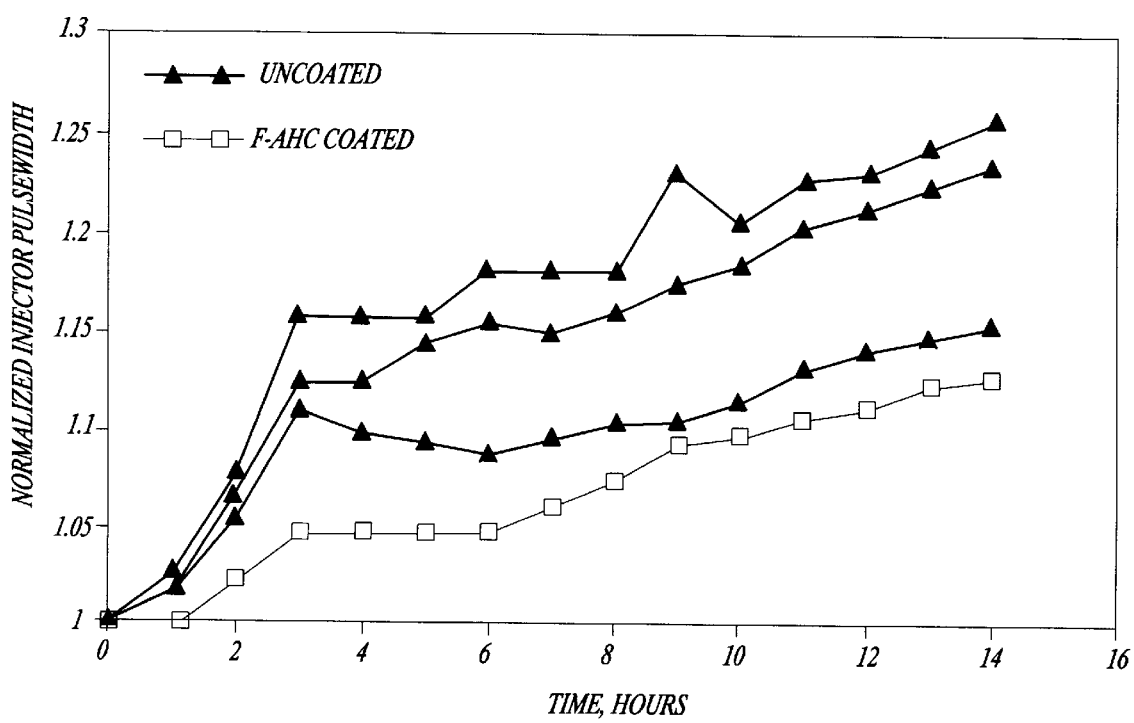
FIG. 3 shows a plot of the normalized injector pulse width for coated and uncoated fuel injectors.

FIG. 3 shows a plot of the injector pulse width required to maintain constant A/F normalized to its value at the beginning of the test as a function of time in hours of engine operation. A typical injector pulse width is a few milliseconds. The increase in normalized pulse width corresponds to an increase in the restriction of flow due to deposits. Four curves are shown. Three characterized by full triangular data points correspond to injectors with uncoated face plates. The variability presumably corresponds to the variability in the deposition process. The curve with open squares for data points corresponds to the injector with the F-AHC coating. The reduced increase in pulse width with time shows the advantage of the coating in resisting unwanted deposit formation.

The F-AHC coating was approximately 1 micron in thickness. This is a value which past experience has shown to be adequate for durability in many automotive applications. The amount of fluorine in the present coatings was estimated to be approximately 10% by volume.

While the best mode and viable alternate embodiments for carrying out the invention have been described in detail as shown on the drawings, those familiar in the art to which this invention relates will recognize various alternative designs and embodiments for practicing the invention as defined by the following claims.

What is claimed is:

1. A deposit-resistant internal combustion engine component, comprising: a coating on at least one surface of the engine component, said surface being susceptible to deposit formation; and said coating being a fluorine-containing amorphous hydrogenated carbon coating made in part from trifluoromethyltrimethylsilane whereby said coating prevents deposit formation on the engine component.

2. The engine component of claim 1, wherein said coating is between 0.1 and 3.0 microns in thickness.

3. The engine component of claim 1, wherein said coating is applied by a plasma assisted chemical vapor deposition technique.

4. The engine component of claim 1, wherein said fluorine-containing amorphous hydrogenated carbon coating is formed from gaseous precursors including methane and tetramethylsilicon and said trifluoromethyltrimethylsilane.

5. The engine component of claim 1, wherein said engine component is a fuel injector made from steel.

6. The engine component of claim 1 wherein the amount of fluorine in said fluorine-containing amorphous hydrogenated carbon coating is approximately 10% by volume.

* * * * *